United States Patent
Yau et al.

(10) Patent No.: US 10,292,247 B2
(45) Date of Patent: May 14, 2019

(54) INTELLIGENT INSTALLATION METHOD OF INDOOR LIGHTING SYSTEM

(71) Applicant: Delight Innovative Technologies Limited, Hong Kong (CN)

(72) Inventors: Kin Hing Yau, Hong Kong (CN); Shih Ping Liou, Hong Kong (CN)

(73) Assignee: Delight Innovative Technologies Limited, Hong Kong (CN)

( * ) Notice: Subject to any disclaimer, the term of this patent is extended or adjusted under 35 U.S.C. 154(b) by 0 days.

(21) Appl. No.: 15/768,364

(22) PCT Filed: Oct. 17, 2016

(86) PCT No.: PCT/CN2016/102290
§ 371 (c)(1),
(2) Date: Apr. 13, 2018

(87) PCT Pub. No.: WO2017/063610
PCT Pub. Date: Apr. 20, 2017

(65) Prior Publication Data
US 2018/0302974 A1 Oct. 18, 2018

(30) Foreign Application Priority Data

Oct. 16, 2015 (CN) .......................... 2015 1 0674288

(51) Int. Cl.
*H05B 37/02* (2006.01)
*G06F 17/50* (2006.01)
(Continued)

(52) U.S. Cl.
CPC ............ *H05B 37/029* (2013.01); *F21S 8/065* (2013.01); *F21S 10/063* (2013.01); *G06F 8/33* (2013.01);
(Continued)

(58) Field of Classification Search
CPC .............. H05B 37/029; H05B 37/0254; H05B 37/0227; H05B 37/0272; H05B 33/0803;
(Continued)

(56) References Cited

U.S. PATENT DOCUMENTS 6,466,234 B1 * 10/2002 Pyle .......................... G06F 8/38
715/771
9,035,572 B1 * 5/2015 Dolan ....................... H02J 3/00
315/291
(Continued)

FOREIGN PATENT DOCUMENTS

CN 101990333 A 3/2011
CN 102592315 A 7/2012
(Continued)

OTHER PUBLICATIONS

International Search Report (and its English translation) and Written Opinion (which states that claims 1-10 lack inventive step, for PCT application No. PCT/CN2016/102290 filed Oct. 17, 2016 which is the parent application to the instant application, dated Dec. 29, 2016, 12 pages.

*Primary Examiner* — Vibol Tan
(74) *Attorney, Agent, or Firm* — Harness, Dickey & Pierce, P.L.C.; Anthony G. Fussner

(57) ABSTRACT

The invention relates to an intelligent installation method of indoor lighting system, characterized in that the method comprises the following steps: firstly design lighting system design diagrams on a computer according to indoor spatial dimensions, including installation lines, installation lighting devices and control scenes that make up the lighting system; and then above-mentioned designed lighting system is automatically implemented installation and debugging using intelligent methods indoors. The method for intelligent installation of indoor lighting system involved in the present invention can be automatically implemented installation and (Continued)

debugging using intelligent methods indoors, so that when the simulation scene of the lighting system is successfully designed, automatic installation and debugging can be performed indoors, which saves a lot of installation human costs.

7 Claims, 2 Drawing Sheets

(51) Int. Cl.
- *G06F 9/448* (2018.01)
- *F21S 10/06* (2006.01)
- *G06F 8/33* (2018.01)
- *F21S 8/06* (2006.01)

(52) U.S. Cl.
CPC .............. *G06F 9/449* (2018.02); *G06F 17/50* (2013.01); *H05B 37/02* (2013.01); *Y02B 20/48* (2013.01)

(58) Field of Classification Search
CPC ............ H05B 33/0842; H05B 33/0854; H05B 33/0863; H05B 33/0869; H05B 41/38; Y02B 20/48; F21S 10/063; H04L 2012/2841; B44F 1/00; F21K 9/60; G06F 8/38; G06F 17/50

See application file for complete search history.

(56) References Cited

U.S. PATENT DOCUMENTS

| | | | |
|---|---|---|---|
| 9,907,149 B1* | 2/2018 | Dolan | F21S 8/06 |
| 2008/0215279 A1* | 9/2008 | Salsbury | H05B 33/0863 702/107 |
| 2010/0283393 A1* | 11/2010 | Boleko Ribas | H05B 37/029 315/152 |
| 2013/0249442 A1 | 9/2013 | Piper | |
| 2014/0168610 A1* | 6/2014 | Spaulding | H04N 9/3105 353/29 |
| 2015/0181680 A1* | 6/2015 | Wang | H05B 37/0254 315/294 |
| 2016/0088708 A1* | 3/2016 | Anthony | H05B 37/029 315/294 |

FOREIGN PATENT DOCUMENTS

| | | |
|---|---|---|
| CN | 202587475 U | 12/2012 |
| CN | 103324807 A | 9/2013 |
| CN | 103619109 A | 3/2014 |
| CN | 203504827 U | 3/2014 |
| CN | 104509215 A | 4/2015 |

\* cited by examiner

INTELLIGENT INSTALLATION METHOD OF INDOOR LIGHTING SYSTEM

This patent application is a U.S. national stage filing under 35 U.S.C. § 371 of International Application No. PCT/CN2016/102290 filed Oct. 17, 2016 (published as WO 2017/063610 on Apr. 20, 2017), which claims priority of Chinese application No. CN201510674288.5 filed Oct. 16, 2015. The disclosures of the applications identified in this paragraph are incorporated herein by reference in their entirety.

TECHNOLOGY FIELD

The present invention relates to an installation technology of lighting systems, and more particularly to an intelligent installation method of a lighting system that presents different lighting scenes.

BACKGROUND TECHNIQUE

Before performing interior decoration, software design of indoor lighting system is usually performed, and then lamps are installed and controlled according to designed patterns. Unfortunately, the installation of the lighting system still requires construction personnel on the construction site to be in accordance with the design drawings of the designer, a lot of manpower are consumed during construction, and the installation and construction personnel must cooperate with the designers, or must be the construction personnel who understand the drawings, and thus require expensive professional personnel, and the construction costs large manpower and capital costs.

SUMMARY OF THE INVENTION

The invention solves the problem that the lighting system designed by the software must also consume professional when installing, and provides an intelligent installation method of indoor lighting system.

The technical solution of the present invention is as follows:

An intelligent installation method of indoor lighting system, characterized in that the method comprises following steps:

1) Design lighting system design diagrams on a computer according to indoor spatial dimensions, including installation lines, installation lighting devices and control scenes that make up the lighting system;

2) Above-mentioned design lighting system is automatically implemented installation and debugging using intelligent methods indoors.

The intelligent methods comprise designing and rendering design diagrams of the design lighting system, including 3D design and 3D rendering, or, 2D pattern and chart description, and then any of installation lines and devices, and then through DALI digital addressing control lighting devices, to achieve switches of the lighting devices and intelligent dimming and toning thereof, to achieve 3D rendering.

The installation lines and devices are lines and lighting devices with assignable IP addresses, and the design diagram designs scenes of combined lines and lighting devices with different IP addresses, the intelligent method includes assigning corresponding IP addresses for lines and lighting devices according to the design diagram after uniformly installing the lines and the lighting devices, and then automatically adjusting through the DALI to the designing and rendering scenes of the design diagram.

The method further comprises a step of providing an indoor building structure diagram before step 1), the building structure diagram comprises a perspective view.

The design diagram includes electronic drawings including a CAD drawing, a specific internal design diagram, or a perspective view of a perspective software design.

The step 1) further comprises following steps: select a solution in the electronic drawing, the solution refers to an solution at a moment, render the result; the lamps constituting the scene correspond to their respective illumination intensity of illuminating, both are recorded and stored, and the illumination intensity is a proportional relationship with respect to their maximum values, and the maximum value refers to a rated energy level, for example 20 watts.

Drive level values are recorded and matched to the illumination intensity of illuminating of each lamp.

The illumination intensity of illuminating is generated as a lamp illumination command, such as
 a) Lamp 1—47%
 b) Lamp 2—58%
 c) And so on.

A driving signal is required to be automatically input the lighting system, and the lighting system can use a lighting control system of DELIGHT series.

The scene is named, the named scene includes a scene number and a user-readable name, and the scene is input into the lighting system.

Each additional scene is repeated according to above method.

When all scenes are input, render the result is a series of scenes, including:
 a) Each scene is provided in the software;
 b) All scenes have their names and have their serial numbers in the actual determined control system.

The lamp is installed according to above design.

New scenes after installation can be added without going to the real scene.

The technical effect of the invention is as follows:

The method involved in the present invention can be automatically implemented installation and debugging using intelligent methods indoors, so that when the simulation scene of the lighting system is successfully designed, automatic installation and debugging can be performed indoors, which saves a lot of installation human costs. At the same time, the lighting effect is very close to the original design, so that the design effect is achieved even if no one goes to the real scene (but just creates the scene elsewhere) (in other words, the person concerned only needs to create a scene in his/her convenient place without going to the real scene).

DESCRIPTION OF THE PREFERRED EMBODIMENTS

Figure 1:
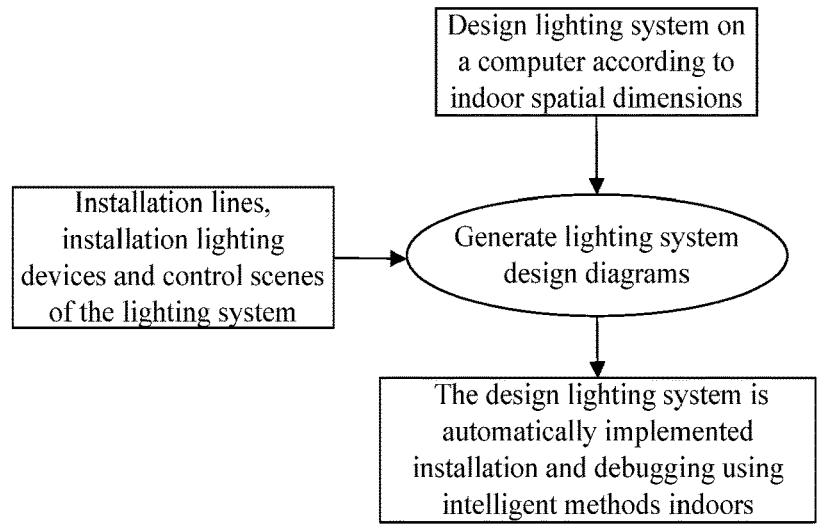
FIG. 1 is a flow chart of an intelligent installation method of indoor lighting system of the present invention.

FIG. 1 is a flow chart of an intelligent installation method of indoor lighting system according to the present invention. As shown in FIG. 1, the method specifically includes following steps:

1) Design lighting system design diagrams on a computer according to indoor spatial dimensions, including installation lines, installation lighting devices and control scenes that make up the lighting system;

2) Above-mentioned design lighting system is automatically implemented installation and debugging using intelligent methods indoors, for example, the installation and debugging of actual lighting scenes can be automated using such intelligent light control devices.

Figure 2:
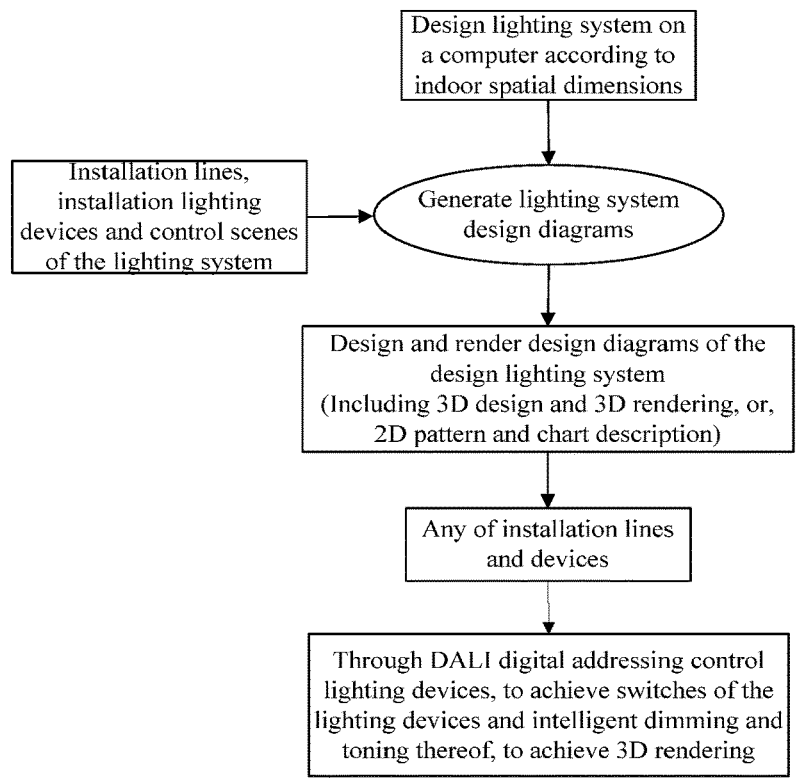
FIG. 2 is a flow chart of a preferred method of intelligent installation of indoor lighting system of the present invention.

FIG. 2 is a flow chart of a preferred method of intelligent installation of indoor lighting system according to the present invention. As shown in FIG. 2, the method specifically includes following steps:

1) Design lighting system design diagrams on a computer according to indoor spatial dimensions, including installation lines, installation lighting devices and control scenes that make up the lighting system;

2) Designing and rendering design diagrams of the design lighting system, 3D design and 3D rendering, or, 2D pattern and chart description can be used according to the actual design applications;

3) Install any of installation lines and lighting devices indoors, such as on the ceiling;

4) Digital addressing and control of lighting devices via DALI (Digital Addressable Lighting Interface) enables switching of the lighting devices and intelligent dimming and toning thereof to achieve 3D rendering effects; of course, other addressing controlling mode that realizes switching of the lighting devices and intelligent dimming and toning thereof to achieve 3D rendering of the actual lighting scene can also be used.

Figure 3:
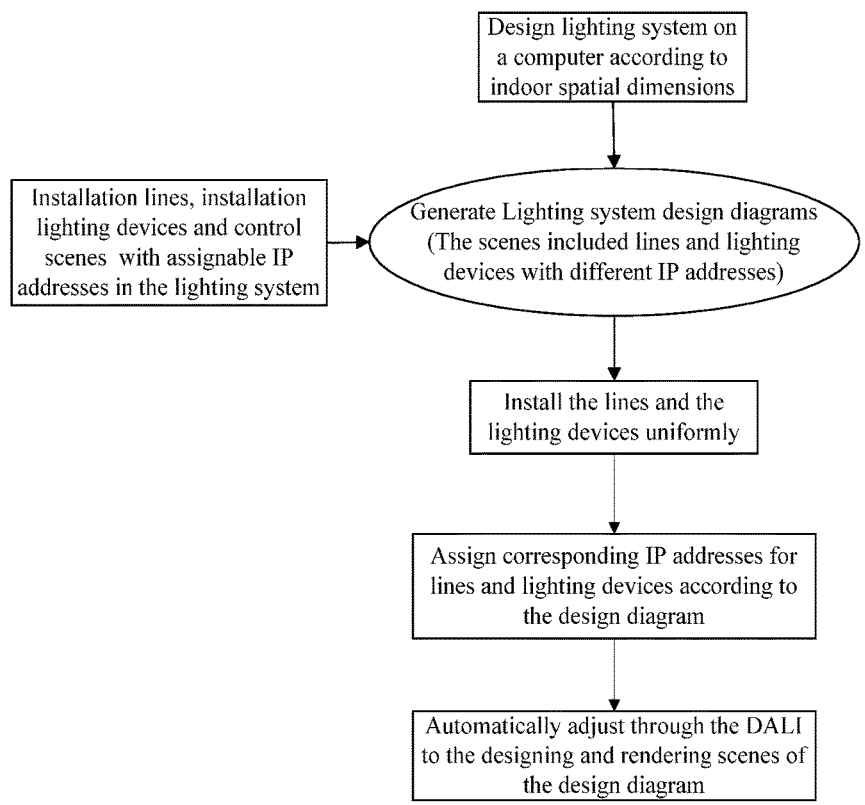
FIG. 3 is a flow chart of another preferred method of intelligent installation of indoor lighting system of the present invention.

FIG. 3 is a flow chart of another preferred method of intelligent installation of indoor lighting system according to the present invention. As shown in FIG. 3, the method specifically includes following steps:

1) Design lighting system design diagrams on a computer according to indoor spatial dimensions, including installation lines, installation lighting devices and control scenes that make up the lighting system; the installation lines and devices are lines and lighting devices with assignable IP addresses, and the design diagram designs scenes of combined lines and lighting devices with different IP addresses;

2) Install evenly the lines and lighting devices indoors, such as on the ceiling;

3) Assigning the corresponding IP addresses for lines and lighting devices according to the design diagram;

4) Automatically adjusting through the DALI to the designing and rendering scenes of the design diagram; of course, other addressing controlling mode that realizes switching of the lighting devices and intelligent dimming and toning thereof to achieve 3D rendering of the actual lighting scene can also be used.

The embodiment 4:

1) Provide an indoor building structure diagram, and the building structure diagram comprises a perspective view.

Design lighting system design diagrams on a computer according to indoor spatial dimensions, including installation lines, installation lighting devices and control scenes that make up the lighting system; the installation lines and devices are lines and lighting devices with assignable IP addresses, and the design diagram designs scenes of combined lines and lighting devices with different IP addresses;

The design diagram includes electronic drawings including a CAD drawing, a specific internal design diagram, or a perspective view of a perspective software design.

Select a solution in the electronic drawing, the solution refers to an solution at a moment, render the result; the lamps constituting the scene correspond to their respective illumination intensity of illuminating, both are recorded and stored, and the illumination intensity is a proportional relationship with respect to their maximum values, and the maximum value refers to a rated energy level, for example 20 watts; drive level values (size of the drive) are recorded and matched to the illumination intensity of illuminating of each lamp, which is generated as a lamp illumination command, such as a) Lamp 1—47% b) Lamp 2—58% c) And so on.

A driving signal is required to be automatically input the lighting system, and the lighting system can use a lighting control system of DELIGHT series.

The scene is named, the named scene includes a scene number, a user-readable name, and the like, and the scene is input into the lighting system.

Each additional scene is repeated according to above method.

When all scenes are input, render the result is a series of scenes, including:

a) Each scene is provided in the software;

b) All scenes have their names and have their serial numbers in the actual determined control system.

2) Install evenly the lines and lighting devices indoors, such as on the ceiling, including lamps, since above installation is evenly installed, it can be completely completed by machine without the need for personnel to go to the site; and for those that have been evenly installed, next step is carried out directly:

3) Assigning the corresponding IP addresses for lines and lighting devices according to the design diagram;

4) Automatically adjusting through the DALI to the designing and rendering scenes of the design diagram; the lamp is installed or distributed according to above design. New scenes after installation can be added without going to the real scene.

The above design lighting effect is very close to the original design, so that the design effect is achieved even if no one goes to the real scene (but just creates the scene elsewhere) (in other words, the person concerned only needs to create a scene in his/her convenient place without going to the real scene).

It should be noted that the specific embodiments described above may enable those skilled in the art to more fully understand the invention, but not in any way limit the invention. Accordingly, although the present specification has been described in detail with reference to the accompanying drawings and examples, it will be understood by those skilled in the art that modifications may be made to the present invention or equivalents may be substituted for the purposes of the present invention. In summary, all technical solutions and modifications that do not depart from the spirit and scope of the present invention are intended to be encompassed by the scope of the invention as claimed.

The invention claimed is:

1. An intelligent installation method of indoor lighting system, characterized in that the method comprises following steps:

1) Design lighting system design diagram on a computer according to indoor spatial dimensions, including installation lines, installation lighting devices and control scenes that make up the lighting system; the design diagram includes electronic drawings including a CAD drawing, a specific internal design diagram, or a perspective view of a perspective software design;

wherein step 1) further comprises following steps: select a solution in the electronic drawing, the solution refers to a solution at a moment, render the result; lamps constituting the scene correspond to their respective illumination intensity of illuminating, both are recorded and stored, and the illumination intensity is a proportional relationship with respect to their maximum values, and the maximum value refers to a rated energy level, for example 20 watts; drive level values are recorded and matched to the illumination intensity of illuminating of each lamp, which is generated as a lamp illumination command, such as
   a) Lamp 1—47%
   b) Lamp 2—58%
   c) And so on;
2) Above-mentioned design lighting system is automatically implemented installation and debugging using intelligent methods indoors; the intelligent methods comprise designing and rendering design diagrams of the design lighting system, including 3D design and 3D rendering, or, 2D pattern and chart description, and then any of installation lines and devices, and then through DALI digital addressing control lighting devices, to achieve switches of the lighting devices and intelligent dimming and toning thereof, to achieve 3D rendering.

2. The intelligent installation method of indoor lighting system according to claim 1, wherein the installation lines and devices are lines and lighting devices with assignable IP addresses, and the design diagram designs scenes of combined lines and lighting devices with different IP addresses, the intelligent method includes assigning corresponding IP addresses for lines and lighting devices according to the design diagram after uniformly installing the lines and the lighting devices, and then automatically adjusting through the DALI to the designing and rendering scenes of the design diagram.

3. The intelligent installation method of indoor lighting system according to claim 1, characterized in that before the step 1), the method further comprises a step of providing an indoor building structure diagram, the building structure diagram comprises a perspective view.

4. The intelligent installation method of indoor lighting system according to claim 1, wherein a driving signal is required to be automatically input the lighting system, and the lighting system can use a lighting control system of DELIGHT series; the scene is named, the named scene includes a scene number and a user-readable name, and the scene is input into the lighting system.

5. The intelligent installation method of indoor lighting system according to claim 4, wherein each additional scene is repeated according to above method, when all scenes are input, render the result is a series of scenes, including:
   A) Each scene is provided in the software;
   B) All scenes have their names and have their serial numbers in the actual determined control system.

6. The intelligent installation method of indoor lighting system according to claim 5, wherein the lamp is installed according to above design.

7. The intelligent installation method of indoor lighting system according to claim 6, wherein a new scene after installation can be added.

* * * * *